(12) United States Patent
Sano

(10) Patent No.: US 7,834,465 B2
(45) Date of Patent: Nov. 16, 2010

(54) SEMICONDUCTOR DEVICE, AND MANUFACTURING METHOD OF SEMICONDUCTOR DEVICE

(75) Inventor: Tsutomu Sano, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 247 days.

(21) Appl. No.: 12/232,004

(22) Filed: Sep. 9, 2008

(65) Prior Publication Data

US 2009/0072416 A1   Mar. 19, 2009

(30) Foreign Application Priority Data

Sep. 13, 2007   (JP) .............................. 2007-238093

(51) Int. Cl.
| H01L 23/48 | (2006.01) |
| H01L 23/52 | (2006.01) |
| H01L 29/40 | (2006.01) |
| H01L 21/44 | (2006.01) |
| H01L 21/48 | (2006.01) |
| H01L 21/50 | (2006.01) |

(52) U.S. Cl. ............... 257/784; 438/121; 257/E21.001; 257/E23.141

(58) Field of Classification Search ................. 257/784, 257/E21.001, E23.141; 438/121
See application file for complete search history.

(56) References Cited

U.S. PATENT DOCUMENTS

| 6,437,453 | B1 | 8/2002 | Koyama et al. | |
| 2002/0043401 | A1* | 4/2002 | Prindiville et al. | .......... 174/260 |
| 2009/0135569 | A1* | 5/2009 | Williams et al. | ............ 361/772 |
| 2009/0189288 | A1* | 7/2009 | Beaman et al. | ............. 257/773 |
| 2010/0032818 | A1* | 2/2010 | Pilling et al. | ................. 257/676 |
| 2010/0147552 | A1* | 6/2010 | Qin et al. | ................. 174/126.1 |

FOREIGN PATENT DOCUMENTS

| JP | 11-67808 | 3/1999 |
| JP | 2000-216188 | 8/2000 |

* cited by examiner

*Primary Examiner*—David S Blum
(74) *Attorney, Agent, or Firm*—McGinn IP Law Group, PLLC

(57) ABSTRACT

In a technique connecting between bonding pads of semiconductor chips, contact between wires is prevented. A semiconductor device of the present embodiment is provided with a semiconductor chip 1 in which a plurality of bonding pads 3 are arranged in line, a semiconductor chip 2 in which a plurality of bonding pads 4 are arranged in line substantially parallel to the plurality of bonding pads 3, and a plurality of wires 7 which connect the bonding pads 3 to the bonding pads 4 respectively. At least one of the wires 7 is bended with respect to a reference straight line S which passes through the bonding pad 3 and the bonding pad 4 which are connected by the wire 7. The bended wire is extended out from the bonding pad 4 in a certain direction in which a distance between the bended wire and an adjacent wire which is adjacent to the bended wire is larger than a distance between the reference straight line of the bended wire and the reference straight line of the adjacent wire.

9 Claims, 5 Drawing Sheets

SEMICONDUCTOR DEVICE, AND MANUFACTURING METHOD OF SEMICONDUCTOR DEVICE

BACKGROUND OF THE INVENTION

1. Field of the Invention

The present invention relates to a semiconductor device including a semiconductor chip connected by the wire bonding.

2. Description of the Related Art

Japanese Patent Laid-Open No. 2000-216188 and Japanese Patent Laid-Open No. 11-67808 are cited as a conventional wire bonding technique for the semiconductor device.

For example, in a wire bonding method described in Japanese Patent Laid-Open No. 2000-216188, a bonding wire is used to connect between an electrode included in the semiconductor chip and a lead. In this method, the wires are positioned by bending the wires in their middle by means of pins to prevent contact between the wires.

In a technique described in Japanese Patent Laid-Open No. 11-67808, wires are inclined in a sealing resin flowing-direction to prevent contact between adjacent wires during mold resin sealing.

However, the recent demand for high performance and small packaged semiconductor chips has called for reduction in a pitch between pads. The wiring has become complex because of the SIP (Single In-Line Package) structure. Particularly, as the number of wirings between the semiconductor chips has increased, the distance between the adjacent wires has become narrower under the restriction on the arrangement of the semiconductor chips. Since this causes a concern for short-circuit of the wires or the like, it is necessary to extend a distance between the wires.

Since the techniques described in Japanese Patent Laid-Open No. 2000-216188 and Japanese Patent Laid-Open No. 11-67808 are a technique for connecting a bonding pad of the semiconductor chip with a lead, the arrangement on the lead side is less restricted. For example, in the technique described in Japanese Patent Laid-Open No. 2000-216188, the leads are positioned with the center-to-center distance between the leads wider than that between the bonding pads to widen the pitch between wires.

On the other hand, when the bonding pads are connected to each other, the arrangement of the bonding pads imposes a restriction. Specifically, the bonding pads are arranged in line on the semiconductor chip. Thus, when the semiconductor chips whose sizes are different from each other, or the semiconductor chips in which the distances between the bonding pads are different from each other are connected to each other, the wire connected between the bonding pads is angled, and therefore the distance between the adjacent wires becomes narrower.

The present invention has been made in consideration of the above circumstance, and the technique for connecting between the bonding pads of the semiconductor chips prevents contact between the wires.

SUMMARY

The present invention provides a semiconductor device provided with a first semiconductor chip in which a plurality of first bonding pads are arranged in line, a second semiconductor chip in which a plurality of second bonding pads are arranged in line substantially parallel to the plurality of first bonding pads, and a plurality of wires each connecting the first bonding pad to the second bonding pad, respectively, and in the semiconductor device, at least one wire is bended with respect to a reference straight line passing through the first bonding pad and the second bonding pad which are connected by the wire, and the bended wire is extended out from the second bonding pad in a certain direction in which a distance between the bended wire and an adjacent wire which is adjacent to the bended wire is larger than a distance between the reference straight line of the bended wire and the reference straight line of the adjacent wire.

According to the present invention, the wire is bended so that the distance between the wires becomes larger than the distance between the reference straight lines, and is connected between the bonding pads arranged in a substantially parallel straight line. Thereby, it is possible to widen the space between the wires, and to prevent contact between the adjacent wires which causes shot-circuit or the like.

The present invention provides a method for manufacturing a semiconductor device provided with a first semiconductor chip in which a plurality of first bonding pads are arranged in line, a second semiconductor chip in which a plurality of second bonding pads are arranged in line substantially parallel to the plurality of first bonding pads, and a plurality of wires each connecting the first bonding pad to the second bonding pad, respectively, and in the semiconductor device, at least one wire is bended with respect to a reference straight line passing through the first bonding pad and the second bonding pad which are connected by the wire, and the bended wire is extended out from the second bonding pad in a certain direction in which a distance between the bended wire and an adjacent wire which is adjacent to the bended wire is larger than a distance between the reference straight line of the bended wire and the reference straight line of the adjacent wire.

DETAILED DESCRIPTION OF THE PREFERRED EMBODIMENTS

Embodiments of the present invention will be described below by using the drawings. Meanwhile, in all the drawings, the same code is attached to the same component, and the description will be arbitrarily omitted.

Figure 1:
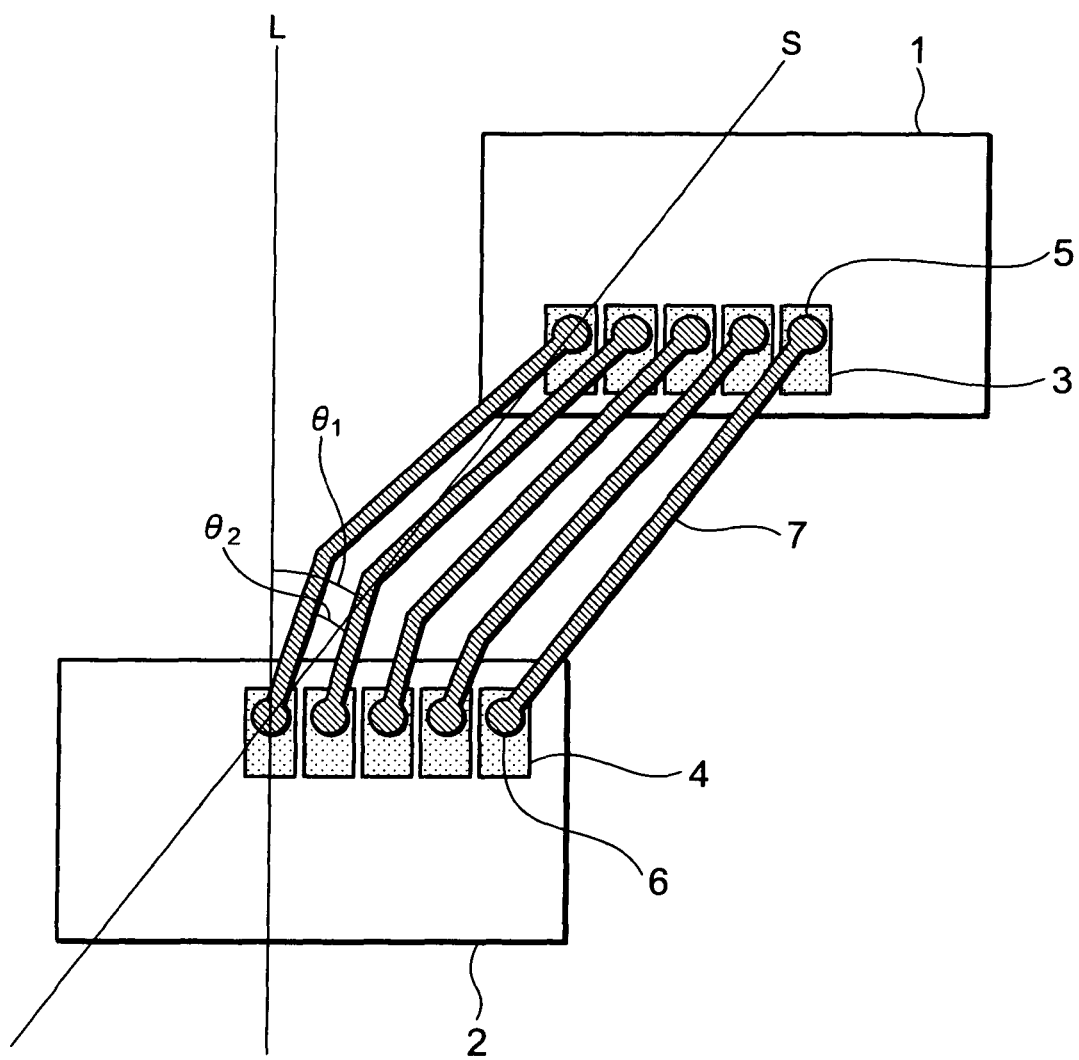
FIG. 1 is a plain view typically illustrating a semiconductor device according to an embodiment.

FIG. 1 is a plain view typically illustrating a semiconductor device of the present embodiment. The semiconductor device of the present embodiment is provided with a semiconductor chip 1 in which a plurality of bonding pads 3 are arranged in line, a semiconductor chip 2 in which a plurality of bonding pads 4 are arranged in line substantially parallel to the plurality of bonding pads 3, and a plurality of wires 7 each connecting the bonding pad 3 to the bonding pad 4, respectively. The bonding pads 3 and the bonding pads 4, which are connected by the wires 7 respectively, are positioned at positions relatively displaced in aligned direction. At least one of the wires 7 is bended with respect to a reference straight line S which passes through the bonding pad 3 and the bonding pad 4 which are connected by the wire 7. The bended wire is extended out from the bonding pad 4 in a certain direction in which a distance between the bended wire and an adjacent wire which is adjacent to the bended wire is larger than a distance between the reference straight line of the bended wire and the reference straight line of the adjacent wire.

A rising part (not-illustrated) of the wire 7 is formed in a bonding part 5 connecting the bonding pad 3 with the wire 7, and an inclined part (not-illustrated) of the wire 7 is formed in a bonding part 6 connecting the bonding pad 4 with the wire 7. The rising part is formed by setting up the wire 7 in a substantially perpendicular direction for a surface of the bonding pad 3. The inclined part is formed by setting the wire 7 in a substantially parallel direction for a surface of the bonding pad 4.

The bonding part 5 connects the bonding pad 3 with the wire 7 through a ball (not-illustrated), and the rising part is formed on an upper side of the ball.

When the formula of $0<\theta 2<\theta 1$ is satisfied, the distance between wires can be larger, where $\theta 1$ is an angle formed between a line L orthogonal to the aligned direction of the bonding pads 4 and the reference straight line S of the bended wire, and $\theta 2$ is an angle formed between an extending direction of the bended wire and the reference straight line S. The bended wire may also be extended out in a direction which is substantially orthogonal to the aligned direction of the bonding pads 4. Thereby, it is possible to maximize the distance between the wires, and to efficiently prevent contact between the wires. In the present embodiment, it is assumed that "substantially orthogonal" includes an error area of ±5° for 90°.

A bending point may be provided by bending the wire 7. The bending point can be provided at a position which is displaced by turns in the aligned direction of the bonding pads 4.

The semiconductor chip 1 and the semiconductor chip 2 may be positioned in parallel, or may be stacked.

Figure 5A:
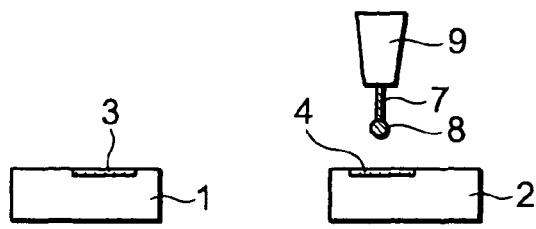
FIGS. 5A to 5F are diagrams describing a method for manufacturing the semiconductor device according to the embodiment.
Figure 5B:
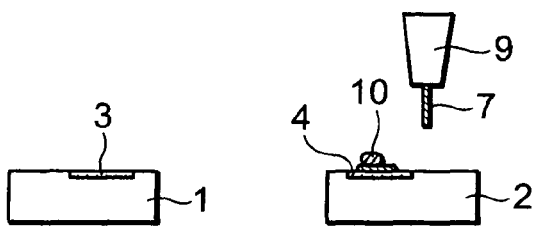
Figure 5C:
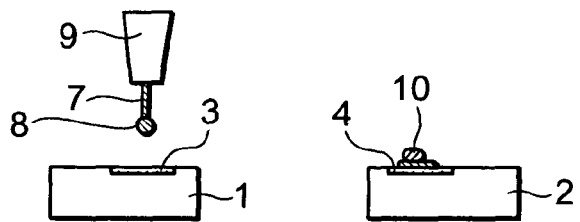
Figure 5D:
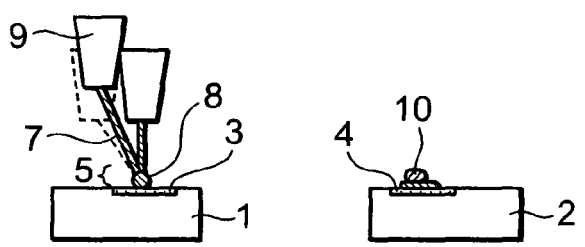
Figure 5E:
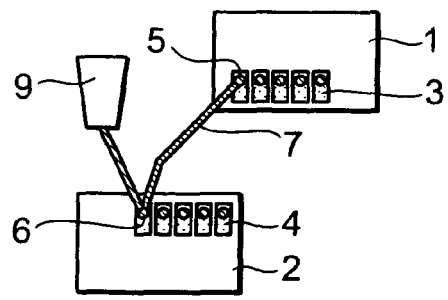
Figure 5F:
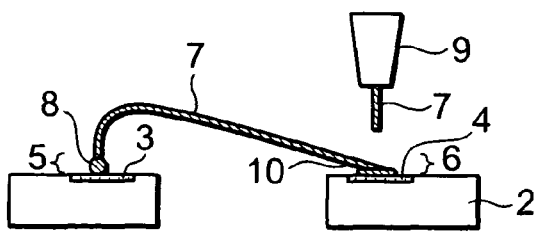

Next, a method for manufacturing the semiconductor device of the present embodiment will be described by using FIG. 5. A ball 8, which is formed at a tip of the wire 7 inserted into a capillary 9, is connected to the bonding pad 4 (A), a bump 10 is formed, and the wire 7 is cut (B). Next, the ball 8 of the tip of the wire 7 inserted into the capillary 9 is connected to the bonding pad 3 (C), the rising part of the wire 7 is formed on top of the formed ball 8, and the bonding part 5 is formed (D). Since the capillary 9 is moved, the wire 7 is bended, the bended wire is formed (E), and by connecting the wire 7 to the bonding pad 4 through the bump 10, the bonding part 6 is formed (F). Meanwhile, FIGS. 5A to 5D and 5F are pattern diagrams illustrating a producing process, which is viewed from a lateral side, for the semiconductor device of the present embodiment, and FIG. 5E is a pattern diagram illustrating the producing process, which is viewed from an upper side, for the semiconductor device of the present embodiment.

Next, the advantageous effect of the present embodiment will be described. According to the semiconductor device of the present embodiment as illustrated in FIG. 1, the wire 7 is bended so that the distance between the wires 7 becomes larger than the distance between the wire 7 and the reference straight line S, and the bonding pad 3 and the bonding pad 4, which are arranged on a straight line, are connected. Thereby, it is possible to widen the space between the wires, and to prevent contact between the adjacent wires which causes shot-circuit or the like.

Figure 3A:
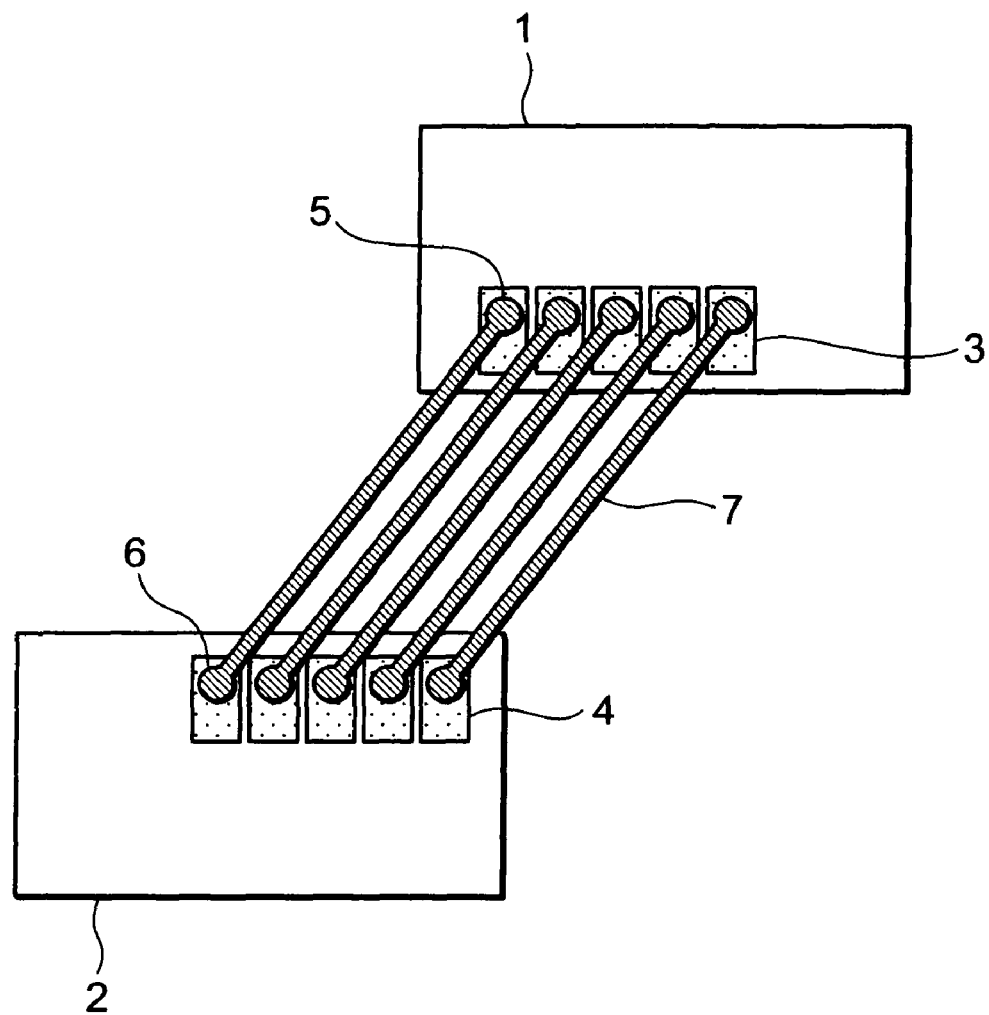
FIG. 3A is a plain view typically illustrating the semiconductor device to be compared.
Figure 3B:
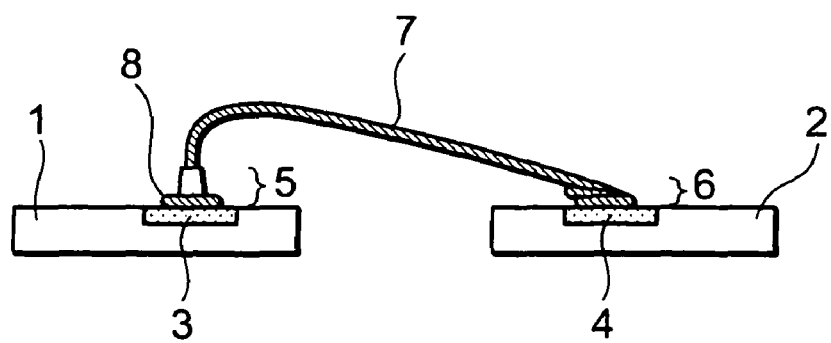
FIG. 3B is a cross-section view typically illustrating the semiconductor device to be compared.

FIG. 3 is a diagram illustrating the semiconductor device to be compared in which the wire is not bended. FIG. 3A is a plain view of the semiconductor device to be compared, and FIG. 3B is a cross-section view of the semiconductor device to be compared. Meanwhile, a cross-section view of the semiconductor apparatus of the present embodiment illustrated in FIG. 1 is also the same as that of FIG. 3B. In the wire bonding method, the ball 8, which is formed at the tip of the wire 7 inserted into the capillary, is bonded on the bonding part 5 between the bonding pad 3 and the wire 7, and the wire 7 itself is bonded on the bonding part 6 between the bonding pad 4 and the wire 7. For a wire loop shape, the rising part is formed on top of the ball provided on the bonding part 5, and the wire 7 near the bonding part 6 is inclined on the lower side to be formed at the lower position. Thus, the wires 7 near the bonding part 6 are likely to be highly disturbed, and therefore, there is a particular problem of contact between the adjacent wires in case of a narrowed pad.

Since the semiconductor chip 1 and the semiconductor chip 2 of FIG. 3 are laterally shifted to each other, similarly to FIG. 1, the wire 7 for wiring the semiconductor chip 1 and the semiconductor chip 2 is angled. This reduces the space between the adjacent wires 7, and short-circuit may be caused by the disturbed wires 7 or the like between the adjacent wires 7.

Thus, it is necessary to enlarge the space between wires to prevent contact between the wires which causes shot-circuit. Particularly, at the bonding part 6 where the wire is inclined, the wires 7 are likely to be disturbed, and therefore, the loop stability and the extended distance between the wires are also necessary in order to achieve stable assembly.

According to the present embodiment, as illustrated in FIG. 1, the wire 7 is bended so that the distance between the wires 7 becomes larger than the distance between the wire 7 and the reference straight line S, and the bonding pad 3 and the bonding pad 4, which are arranged on a straight line, are connected. Thereby, it is possible to widen the space between the wire 7 and the adjacent wire 7. In addition, bending the wire 7 on a side of the bonding part 6 can widen the space between the adjacent wires at a location where the wires 7 are likely to be disturbed.

Figure 4:
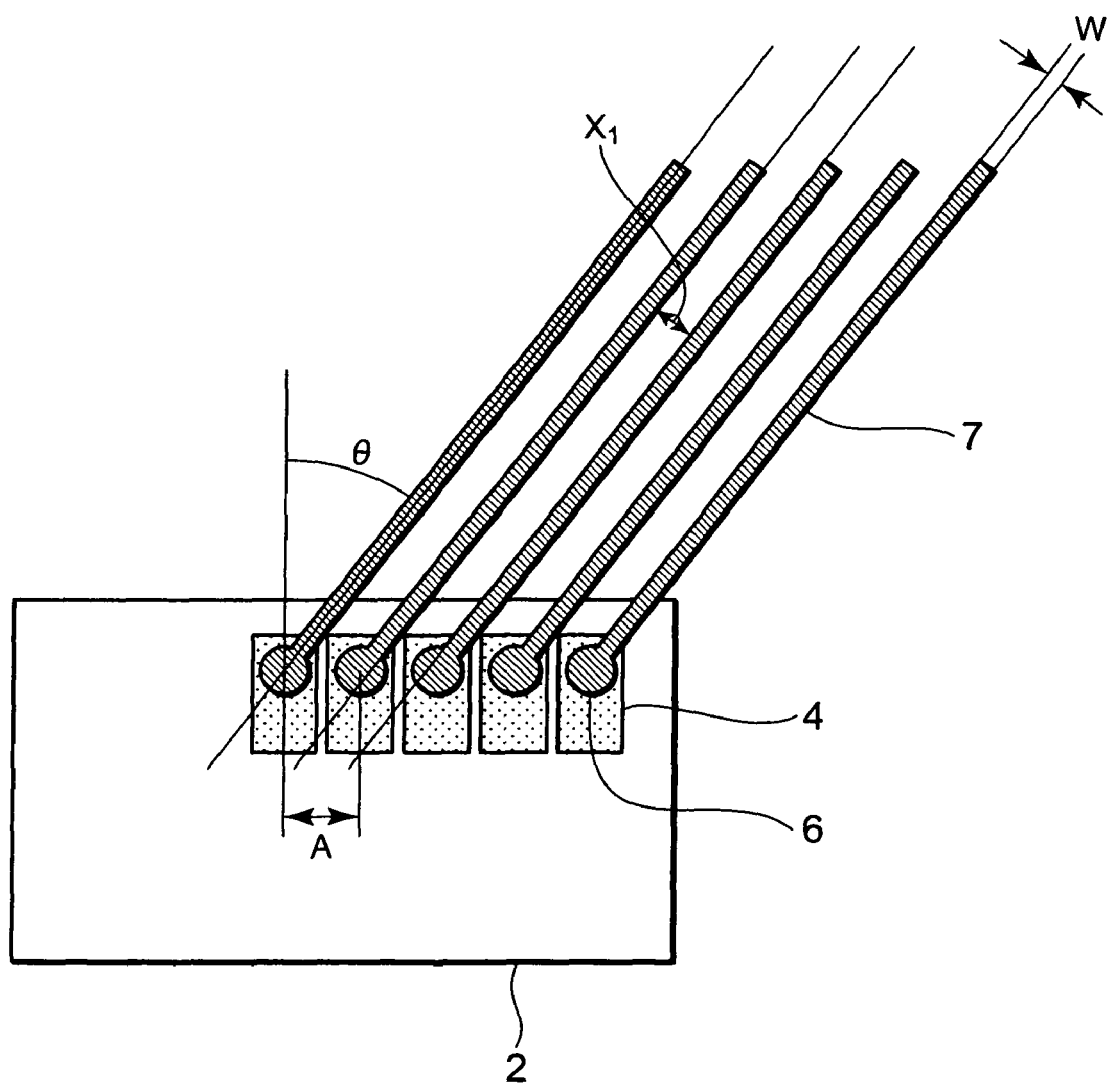
FIG. 4 is a plain view typically illustrating the semiconductor device to be compared.

FIG. 4 is an expanded diagram of the semiconductor chip 2 illustrated in FIG. 3. If W is designated as a width of the wire 7, in the semiconductor device in which the wire 7 is not bended, the distance X between the wires 7 is expressed by $X = A \sin \theta - W$. For example, If $\theta = 30°$, the distance X between the wires 7 can be expressed by $X1 = A/2 - W$.

Figure 2:
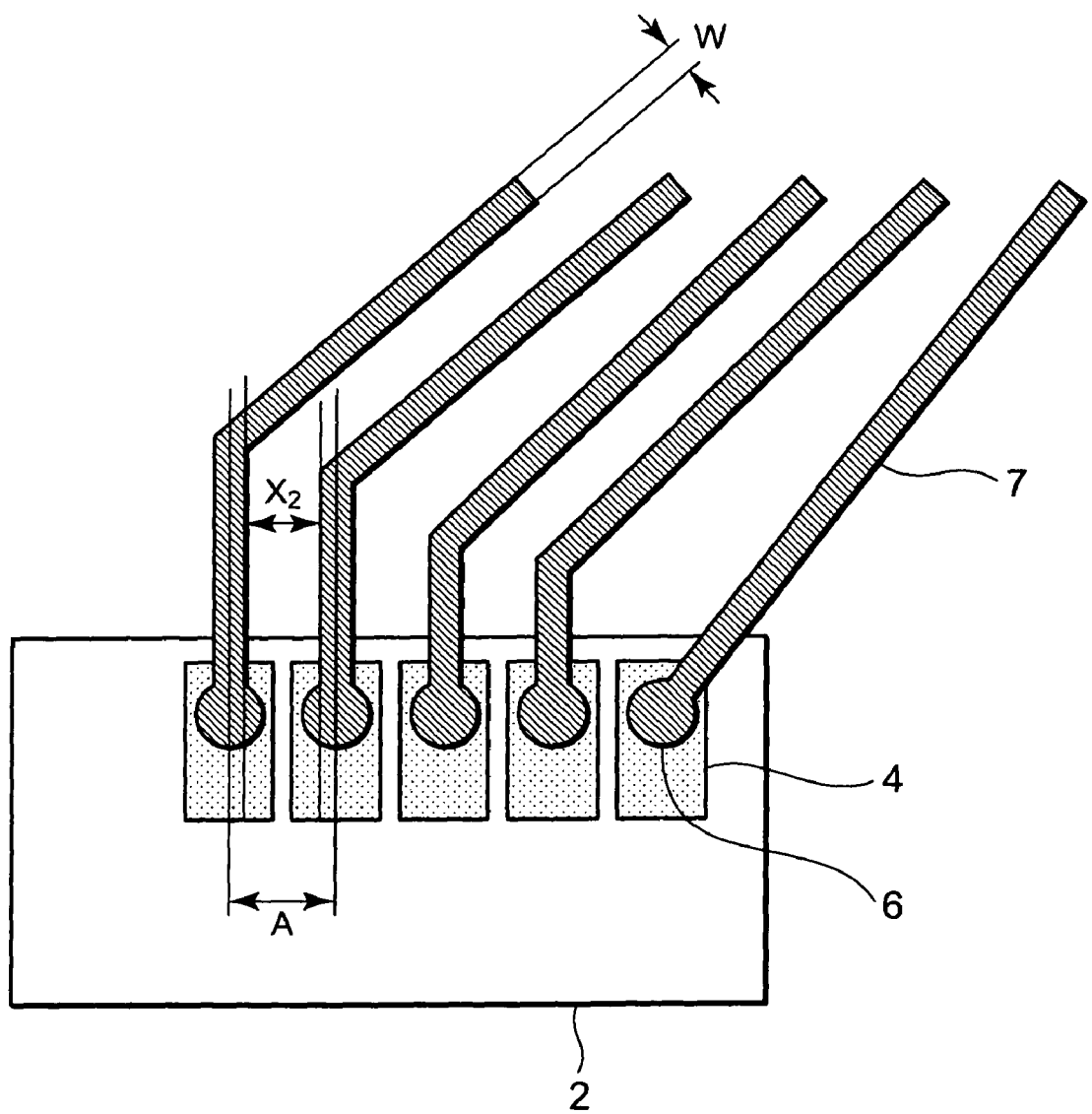
FIG. 2 is a diagram describing the advantageous effect of the semiconductor device according to the embodiment.

On the other hand, according to the present embodiment, by bending the wire 7, it is possible to extend the distance between the adjacent wires. FIG. 2 illustrates an expanded diagram of the semiconductor chip 2 illustrated in FIG. 1. In FIG. 2, the wire is bended so that an equation of $\theta 1 = \theta 2$ can be satisfied, That is, in FIG. 2, the wire 7 is extended out from the bonding pad 4 in a direction orthogonal to the aligned direction of the bonding pads 4. In this case, the distance between the wires X2 is expressed by $X2 = A - W$. Thus, it is possible to increase the distance between the wires as twice as X1 which is the distance between the wires in the comparative semiconductor device.

As described above, according to the present embodiment, by bending the wire 7 in a direction substantially perpendicular to the aligned direction of the bonding pads 4, it is possible to extend the distance between the adjacent wires, and to prevent contact between the wires even when the distance between centers of the bonding pads is small.

As described above, while the embodiments of the present invention have been described with reference to the drawings, such embodiments are exemplifications of the present invention, and a variety of configurations other than the above embodiments can be also adopted.

What is claimed is:

1. A semiconductor device, comprising:
   a first semiconductor chip in which a plurality of first bonding pads are arranged in line;
   a second semiconductor chip in which a plurality of second bonding pads are arranged in line substantially parallel to the plurality of first bonding pads; and
   a plurality of wires each connecting the first bonding pad to the second bonding pad, respectively,
   wherein at least one of the wires is bended with respect to a reference straight line passing through the first bonding pad and the second bonding pad which are connected by the wire, and
   the bended wire is extended out from the second bonding pad in a certain direction in which a distance between the bended wire and an adjacent wire which is adjacent to the bended wire is larger than a distance between the reference straight line of the bended wire and the reference straight line of the adjacent wire.

2. The semiconductor device according to claim 1, wherein a formula of 0<θ2<θ1 is satisfied, where θ1 is an angle formed between a line orthogonal to the aligned direction of the second bonding pads and the reference straight line of the bended wire, and θ2 is an angle formed between an extending direction of the bended wire and the reference straight line of the bended wire.

3. The semiconductor device according to claim 1, wherein the bended wire is extended out in a substantially orthogonal direction in the aligned direction of the second bonding pads.

4. The semiconductor device according to claim 1, wherein a rising part of the wire is formed in a first bonding part connecting the first bonding pad with the wire, and an inclined part of the wire is formed in a second bonding part connecting the second bonding pad with the wire.

5. The semiconductor device according to claim 4, wherein the first bonding part connects the first bonding pad with the wire through a ball, and the rising part is formed in an upper side of the ball.

6. The semiconductor device according to claim 1, wherein a pad distance between the first bonding pads is the same as that between the second bonding pads.

7. A semiconductor device, comprising:
   a first semiconductor chip in which a plurality of first bonding pads are arranged in line;
   a second semiconductor chip in which a plurality of second bonding pads are arranged in line substantially parallel to the plurality of first bonding pads,
   a first wire connecting one of the first bonding pads to one of the second bonding pads; and
   a second wire, which is adjacent to the first wire, connecting another first bonding pads to another second bonding pads,
   wherein the first distance between the first wire and the second wire in the vicinity of the second bonding pads is larger than the second distance between the first wire and the second wire in the vicinity of the first bonding pads.

8. The semiconductor device according to claim 7, wherein the first distance is the distance between the first wire and the second wire in the portion from the second bonding pads to the bending point of at least one bended wire.

9. A method for manufacturing a semiconductor device including a first semiconductor chip in which a plurality of first bonding pads are arranged in line, a second semiconductor chip in which a plurality of second bonding pads are arranged in line substantially parallel to the plurality of first bonding pads, and a plurality of wires each connecting the first bonding pad to the second bonding pad, respectively, wherein, at least one of the wires is bended with respect to a reference straight line passing through the first bonding pad and the second bonding pad which are connected by the wire, and the bended wire is extended out from the second bonding pad in a certain direction in which a distance between the bended wire and an adjacent wire which is adjacent to the bended wire is larger than a distance between the reference straight line of the bended wire and the reference straight line of the adjacent wire; said method for manufacturing comprising:
   forming a bump on the second bonding pad;
   connecting a ball formed at a tip of the wire inserted into a capillary to the first bonding pad, and forming a rising part of the wire in an upper side of the ball to form a first bonding part;
   bending the wire to form a bended wire by moving the capillary; and
   forming a second bonding part by connecting the wire with the second bonding pad through the bump.

* * * * *